United States Patent
Grisham et al.

Patent Number: 6,020,734
Date of Patent: Feb. 1, 2000

[54] ELECTRICAL UTILITY METER WITH EVENT-TRIGGERED WINDOW FOR HIGHEST DEMANDS LOGGING

[75] Inventors: Gregory A. Grisham; Gordon R. Burns, both of West Lafayette, Ind.

[73] Assignee: Siemens Power Transmission & Distribution, Inc., Wendell, N.C.

[21] Appl. No.: 08/905,122

[22] Filed: Aug. 1, 1997

Related U.S. Application Data

[60] Provisional application No. 60/022,961, Aug. 1, 1996.

[51] Int. Cl.⁷ .............................. G01R 11/63; G01R 7/00; G01R 19/00
[52] U.S. Cl. ......................... 324/103 R; 324/142; 702/58
[58] Field of Search ................................ 324/142, 103 R; 702/57, 58, 61, 80

[56] References Cited

U.S. PATENT DOCUMENTS

| | | | |
|---|---|---|---|
| 4,110,825 | 8/1978 | Fox et al. | 324/103 R |
| 4,253,151 | 2/1981 | Bouve | 364/483 |
| 4,301,508 | 11/1981 | Anderson et al. | 364/483 |
| 4,509,128 | 4/1985 | Coppola et al. | 324/103 R |
| 4,511,979 | 4/1985 | Amirante | 364/481 |
| 4,620,150 | 10/1986 | Germer et al. | 324/103 R |
| 4,654,588 | 3/1987 | Munday | 324/103 R |
| 4,670,713 | 6/1987 | Scheib | 324/103 R |
| 4,884,021 | 11/1989 | Hammond et al. | 324/142 |
| 4,896,104 | 1/1990 | Patel et al. | 324/103 P |
| 5,006,790 | 4/1991 | Beverly, II et al. | 324/142 |
| 5,027,285 | 6/1991 | McCartney et al. | 364/483 |

*Primary Examiner*—Josie Ballato
*Assistant Examiner*—Jermele M. Hollington

[57] ABSTRACT

An electrical utility meter includes a controller that determines a list of highest demands using event-triggered windows of time to ensure that only one of the entries on the list corresponds to any one high consumption event. The controller generates a demand value corresponding to the quantity of energy consumed within a demand interval, and then determines whether the demand value for the demand interval is greater than a smallest demand value on a list of highest demands in a memory location. If so, the controller opens a demand window, the demand window having a duration exceeding the demand interval. The controller then obtains a plurality of additional demand values for the duration of the demand window, each of the additional demand values corresponding to one of a plurality of additional demand intervals within the demand window. The controller records in the list of highest demands in the memory location a select one of the demand value and plurality of additional demand values. The select demand value may suitably be the largest demand in the window.

17 Claims, 4 Drawing Sheets

ELECTRICAL UTILITY METER WITH EVENT-TRIGGERED WINDOW FOR HIGHEST DEMANDS LOGGING

CROSS REFERENCE TO RELATED APPLICATION

This Application claims the benefit of U.S. Provisional Application Serial No. 60/022,961, filed Aug. 1, 1996.

FIELD OF THE INVENTION

The present invention relates to the field of electrical utility meters, and in particular, to demand metering in microprocessor-controlled electrical utility meters

BACKGROUND OF THE INVENTION

Electrical utility service providers, or simply utilities, monitor energy usage by customers through watt-hour meters. Watt-hour meters track the amount of energy consumed, typically measured in kilowatt-hours ("kwh"), at each customer's facility. The utilities use the consumption information primarily for billing purposes.

Utilities often bill their customers based on complex rate structures wherein the different billing rates are used for different times of the day, week, or year. For example, 1 kwh of electric energy consumption at noon on a mid-summer day will likely cost the customer significantly more than 1 kwh of electric energy consumption on an autumn evening.

A primary reason for differing utility rate structures is that a utility's fixed charge costs are proportional to maximum demand. A utility must purchase and maintain enough generators to satisfy the peak demand periods, even though much of the generator capacity is unused during non-peak periods. To illustrate this concept, consider a utility with two customers. A first customer has a demand of 10,000 kw of electricity continuously for a total consumption of 240,000 kwh of electricity per day (10,000 kilowatts×24 hours=240,000 kilowatt-hours). A second customer requires only 12,000 kwh of electricity per day, but consumes 12,000 kw over a contiguous one hour time frame. In order to meet peak demand during the day, the utility must purchase and maintain generators that are capable of producing at least 22,000 kw of electricity: 10,000 kw for the first customer and 12,0000 kw for the second customer during peak demand. If the second customer were to divide its energy requirements over the entire day, the utility would only be required to purchase and maintain generators that produce 10,500 kw, as opposed to the 22,000 kw required under the second customer's present demand. Fixed costs on a generator, including interest on the investment, insurance on valuation, property taxes on valuation, and depreciation of equipment add up to a significant percentage of the cost of a new generator. Fixed costs on a 22,000 kw generator are typically significantly greater than fixed costs on a 10,500 kw generator. Therefore, because the second customer contributes in a much larger proportion than the first customer to the utility's fixed costs per hour of demand by the customer, the utility can justify charging customers higher rates during peak demand times.

A second reason for differing utility rate structures is to discourage energy consumption during peak demand periods. As discussed above, the utility's generators are only capable of providing a finite amount of electrical energy. Accordingly, during peak demand periods, such as on a hot day in which air conditioners consume substantial amounts of energy, the utility may be asked to deliver power in excess of its capacity, resulting in a brown-out condition or worse. The utility may avoid such a situation by increasing power capacity, purchasing power from another utility or by curtailing customer demand in peak demand situations. Increasing power capacity involves purchasing new generators, which entails a significant cost investment by the utility. Purchasing power from another utility, on the other hand, is not a reliable option because the other utilities may be contemporaneously experiencing severely high demand. By contrast controlling customer demand by varying rates involves little additional cost to the utility and is not dependent on external sources of energy. By charging higher rates during periods of peak consumption, the utility may drive down customer demand and prevent system overload.

In view of the above mentioned reasons for varying utility rate structures, it is desirable that utilities track peak demand data from its customers. Utilities may then analyze the demand data to develop a coherent billing rate structure. The advent of digital electronics in utility meters has facilitated the implementation of various features that assist in tracking such demand data.

One such feature is a Five Highest Demands (FHD) feature, which has been widely implemented. The FHD feature entails the tracing of the peak power demand times for the facility being metered. In particular, a processor of a watt-hour meter tracks the five highest demand values (FHD values), i.e., the five times that the energy consumption rate was the highest, over a limited time frame, such as a month. The information tracked by the processor is stored in a memory location within the electrical utility meter. The information stored by the FHD feature includes the amount of energy demanded during each high demand event, the date of each high demand event, and the time of day in which each high demand event occurred. The utility uses the FHD information to help identify periods of heavy load for rate structuring and resource allocation.

According to the prior art, the method of assembling the list of high demands begins by splitting a billing period into demand intervals. The demand intervals may be of any time length, but are typically between one and sixty minutes. The demand intervals may either be continuous blocks of time, or overlapping blocks of time. The meter then measures the energy demand interval. Energy demand is merely the aggregate energy consumption during the demand interval. If the meter's processor determines that the demand for any demand interval is one of the five highest of the billing period, then the FHD list is updated to include the new demand measurement (and its corresponding time period) and exclude the previous lowest demand measurement on the list.

A drawback to the above FHD method is that a single peak usage event may occur over several time intervals. In such a case, the final FHD list may contain entries from several time periods from the same peak usage event. For example, if a highest demand event on March 26 lasts for two demand intervals, then two of the five highest demand entries may identify only a single peak usage event. For example, if demand intervals are five minutes and a peak usage event occurs on March 26 from 2:00 p.m. to 2:10 p.m., then one of the entries on the FHD list the highest demand for the month of March is on March 26 at 2:00 p.m., then the second highest demand may well be on March 26 at 2:05 p.m. The resulting FHD list is of limited usefulness, because it reduces the number of discreet high usage events that are recorded.

One prior art solution to the above problem is discussed in U.S. Pat. No. 4,654,588 to Munday ("Munday"). Munday describes an FHD list wherein only one FHD may occur within any one survey period. A survey period is a window of adjacent demand intervals. For example, a survey period may be six adjacent demand intervals. Assuming that six demand intervals occur within each survey period, the system describe in Munday allows only one FHD value to be recorded from the six demand intervals found within the single survey period.

The Munday method, while reducing the likelihood that a single peak usage event will be over-represented on the the FHD list, still suffers the drawback that such an event could possibly be counted twice on the FHD list. Specifically, a single high consumption event may span from the end of one survey period to the beginning of a next survey period. As a result two entries on the FHD list may be from the single high consumption event. For example, if a customer encounters ten minute period of high demand, it is possible that the first five minutes of that high demand period could occur during the final demand interval of a first survey period, and a second five minutes of the high demand period could occur during the first demand interval of a second survey period. In this case, the single high consumption event would be split between two survey periods, and the FHD list would include two listings for the same high consumption event.

Accordingly, a need exists in the industry for an apparatus that records the five highest demands of a billing period wherein the recorded demands result from distinct high consumption events.

SUMMARY OF THE INVENTION

The present invention includes a method of determining a list of highest demand records in an electrical utility meter that uses, event-triggered windows of time to ensure that only one of the entries or records on the highest demands list corresponds to any one high consumption event. The resulting highest demand list provides a more informative list that is not skewed by multiple recognition of a single high consumption event.

In an exemplary embodiment, the present invention comprises an electric utility meter comprising at least one sensor circuit for measuring voltage and current and generating voltage and current measurement signals therefrom, a conversion circuit connected to the sensor circuit and operable to receive voltage and current measurement signals and generate power consumption signals therefrom, a memory location containing a list of highest demands, and a controller. The controller generates a demand value corresponding to the quantity of energy consumed within a demand interval. The controller then determines whether the demand value for the demand interval is greater than a smallest demand value on the list of highest demands in the memory location. If so, the controller opens a demand window, the demand window having a duration exceeding the demand interval. The controller then obtains a plurality of additional demand values for the duration of the demand window, each of said additional demand values corresponding to one of a plurality of additional demand intervals within the demand window. The controller records in the list of highest demands in the memory location a select one of the demand value and plurality of additional demand values. The select demand value may suitably be the largest demand in the window.

Optionally, the demand window has a variable duration. Specifically, the demand window may have a duration that is extended if at any time while the demand window is open, the controller determines that one of the additional demand values exceeds the demand value.

The present invention thus increases the amount of useful data provided by the highest demand list feature. Specifically, the use of a demand window that is opened only when the controller determines that a demand value is large enough to warrant inclusion in the list of highest demands reduces the possibility of double inclusion of a single high consumption event of the highest demand list. To this end, the event-triggered window reduces the possibility that a single highest demand event will occur at the end of one demand window and carry over to the next demand window. Moreover, the use of the optional variable demand window as described above further reduces such risk of double representation.

The above features and advantages, as well as others, will become more readily apparent to those of ordinary skill in the art by reference to the following detailed description and accompanying drawings.

DETAILED DESCRIPTION

Figure 1:
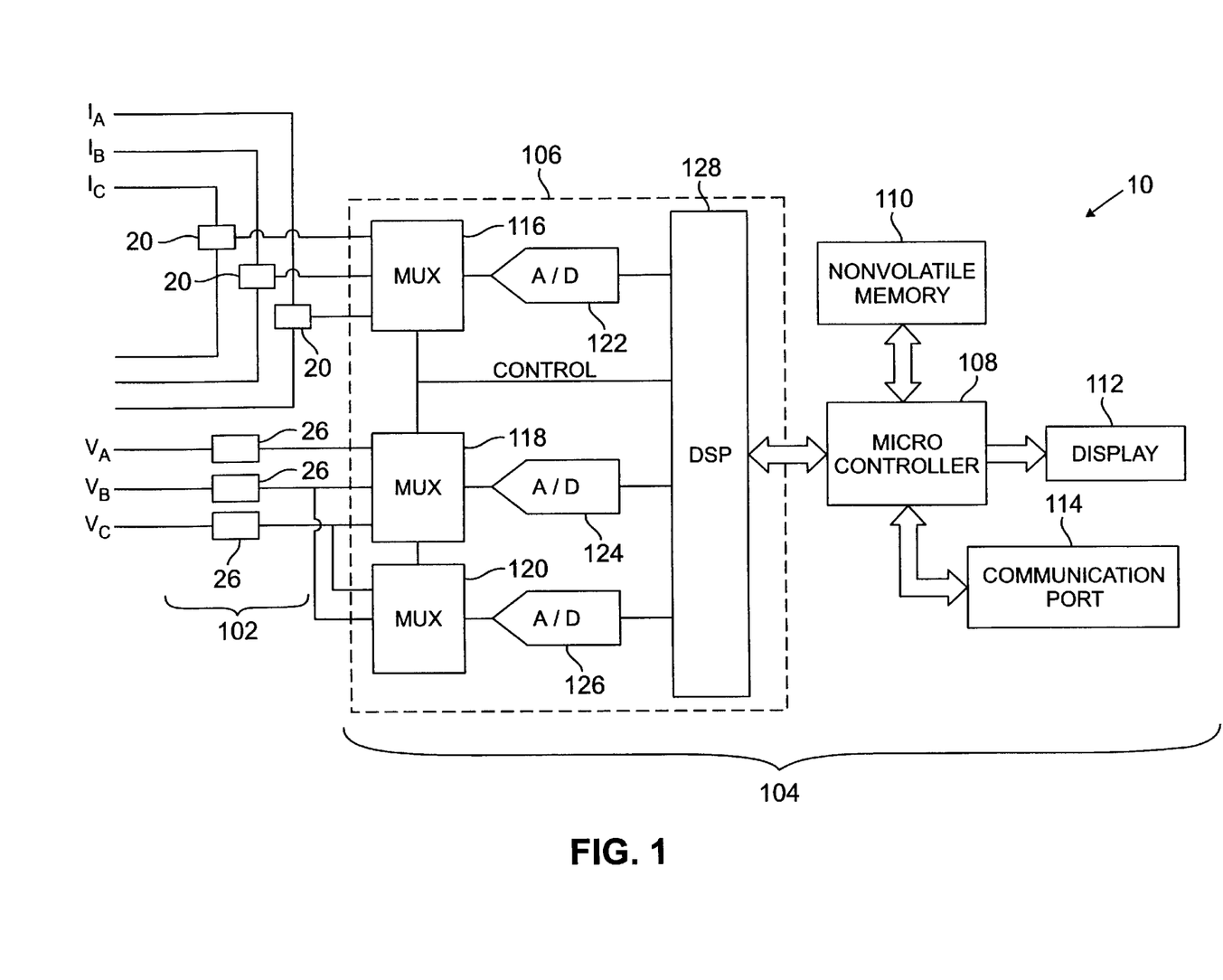
FIG. 1 is a block diagram of an electrical utility meter according to the present invention.

FIG. 1 shows a block diagram of an electrical utility meter 10 according to the present invention.

The exemplary meter 10 is a meter intended to, among other things, measure energy consumption by a load, not shown, connected to an electric utility, not shown. In the exemplary embodiment discussed herein, the utility provides three phase power to the load through a plurality of power lines, not shown. The load, for example, be the electrical system of an industrial or commercial facility. The exemplary meter 10 essentially comprises sensor circuitry 102 and detection or measurement circuitry 104. The sensor circuitry 102 includes polyphase current sensors and polyphase voltage sensors 26. The measurement circuitry 104 further comprises a conversion circuit 106, a processor or controller 108, a nonvolatile memory 110, a display 112, and a communication port 114. The conversion circuit 106 comprises a first multiplexer 116, a second multiplexer 118, a third multiplexer 120, a first analog to digital ("A/D") converter 122, a second A/D converter 124, a third A/D converter 126 and a digital signal processor 128. It will be noted that a three-phase electrical utility meter is given by way of example only. Those of ordinary skill in the art may readily adapt the inventive aspects of present invention to other types of meters, such as single phase or network meters.

The current sensors 20 are each connected to receive signals indicative of the current flowing through one phase of a three phase the power line (i.e., phase A, phase B, and phase C). The current sensors 20 of the exemplary embodiment described herein preferably each include transformers, which are advantageously situated to detect current on each respective phase of the power line. The current sensors 20 are further connected to the measurement circuit 104 through the first multiplexer 116.

The voltage sensors 26 are typically connected directly to the each respective phase of the power line (i.e., phase A, phase B, and phase C) to obtain a voltage measurement therefrom. To this end, the voltage sensors 26 may suitably comprise high resistance voltage dividers. The voltage sensors 26 are further connected to the measurement circuit 104 through the second multiplexer 118.

The conversion circuit 106 is a circuit operable to receive polyphase voltage and polyphase current measurement signals and generate digital signals therefrom, the digital signals include a power consumption signal, voltage phase and magnitude signals, and current phase and magnitude signals. The various components of the conversion circuit 106 may suitably be incorporated onto a single semiconductor substrate. An example of a suitable conversion circuit is the Power Measurement Integrated Circuit found in a model S4 electrical utility meters available from Landis & Gyr Utilities Services, Inc. of Lafayette, Ind.

The controller 108 is operably configured to, and execute programming instructions to receive the digital signals from the conversion circuit 106, monitor and record energy consumption using the digital signals, and analyze the digital signals to generate a highest demand list. The highest demand list is a database containing a record associated with each demand interval in which one of the highest demands for a predetermined time period occurred. The controller 108 is further operable to generate the highest demand list using a demand window that is opened upon occurrence of a highest demand event and during which only one record is added to the highest demand list. The operations of the controller 108 with respect to the highest demand list are discussed in more detail further below. The controller 108 may suitably be a K0 series microcontroller available from NEC. The controller 108 generally includes firmware, or in other words, an integrated memory into which programming instructions are stored. Alternatively, the programming instructions may be stored in the nonvolatile memory 110.

The third multiplexer 120 and third A/D 126 provide additional capabilities to the meter 10 that are outside the scope of the present invention.

In operation, the current sensors 20 detect the current of each respective phase of the power line and generate phase current measurement signals therefrom. The current sensors 20 provide the phase current measurement signals to the first multiplexer 116. Each phase current measurement signal is a signal having a voltage level that is indicative of the instantaneous current level on its respective power line. For the embodiment described herein, the phase current measurement signals have a dynamic range 0.0 volts rms to 0.3 volts rms. Other scaling factors may of course be employed.

The first multiplexer 116, under the control of the controller 108, then provides the instantaneous current measurement signal from one of the phase current measurement signals to the first A/D converter 122. The first multiplexer 116 typically provides each phase in a rapid succession of cycles, such that each phase is provided to the first A/D converter 122 every third cycle. According to the exemplary embodiment described herein, the first multiplexer 116 provides the current measurement signals at a rate of 3.3 kHz.

The first A/D converter 122 receives and samples or digitizes the rapid succession of instantaneous current measurement signals. The first A/D converter 122 then provides to the DSP 128 a stream of digital words, each representing the average magnitude of one of the three phase currents over a particular sampling period.

Contemporaneously, the voltage sensors 26 detect the phase voltage for each respective phase voltage on the power lines. The voltage sensors 26 each provide a phase voltage measurement signal to the second multiplexer 118. Each phase voltage measurement signal is typically a signal having a voltage level that is indicative of the instantaneous voltage level on its respective power line. In the exemplary embodiment described herein, the voltage sensors 26 are configured to provide voltage measurement signals having a dynamic range of 0.0 volts rms to 0.3 volts rms. Other scaling factors may be employed.

The second multiplexer 118 then provides, in serial fashion, the instantaneous phase voltage measurement signal for each respective phase to the second A/D converter 124. The second multiplexer 118 typically provides each phase voltage measurement signal in a rapid succession of cycles, such that each phase is provided to the second A/D converter 124 every third cycle. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals contemporaneously with their corresponding phase voltage measurement signals. For example, in a four wire wye meter configuration, the first multiplexer 116 provides the phase x current measurement signal and the second multiplexer 118 provides the phase x voltage measurement signal contemporaneously, where x rotates among A, B and C. In any event, the second A/D converter 124 receives and samples or digitizes the rapid succession of instantaneous voltage measurement signals. The second A/D converter 124 thus provides to the DSP 128 a stream of digital words, each representing the magnitude of one of the three phase voltage at a particular instant. The first A/D converter 122 and the second A/D converter 124 therefore provide the digital voltage and current measurement signals in a predetermined coordinated phase relationship.

The DSP 128 within the conversion circuit 106 determines power consumption by selectively multiplying the digitized polyphase voltages and the polyphase currents received from the A/D converters 122 and 124, and then adding them together. For example, in a four wire wye configuration, the appropriate power calculation is:

$$\text{POWER} = V_A I_A + V_B I_B + V_C I_C \tag{1}$$

The DSP 128 carries out the above calculation in the manner as follows. The DSP 128 receives the digitized current and voltage measurements from each phase contemporaneously and multiplies them together. The resulting product is added to a running total or sum. In other words, if $\text{DIG\_VOLT}_x$ is digital voltage measurement signal for a phase x and $\text{DIG\_CURR}_x$ is the digital current measurement signal for the phase x, then the DSP 128 carries out the following calculation:

$$\text{POWER} = \Sigma(\text{DIG\_VOLT}_x * \text{DIG\_CURR}_x) \text{ for } x = \{A, B, C, A, B, \ldots\} \tag{2}$$

The controller 108 accumulates the power consumption data from the DSP until the value of POWER exceeds a predefined watt-hour threshold. At that point, the controller 108 generates a power consumption pulse and increments a power consumption counter. The power consumption counter is the primary method by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The controller 108 preferably provides the power consumption counter information to both the nonvolatile memory 110 and the display 112. The display 112 then provides a visual representation of the power consumption counter information from which readings may be taken by utility personnel. The nonvolatile memory 110 stores the power consumption counter information for the purposes of retention in the event of a power interruption.

The controller 108 also generally controls the operation of the conversion circuit 106, and particularly, the first, second, and third multiplexers 116, 118 and 120, respectively, the first, second, and third A/D converters 122, 124 and 126, respectively, and the digital signal processor 128. To this end, the processor provides timing signals and other control signals to the various elements of the conversion circuit 106 as necessary to carry out the operations described above.

In addition to determining customer energy consumption by means of a power consumption counter, the controller 108 of the present invention generates the highest demand list. The highest demand list comprises a database of records associated with a finite number of highest demand events within a billing cycle or other period of time. A highest demand event is a demand interval having one of the highest demand values in the billing cycle. The records in the list identify the time and date of each of the highest demand events as well as the demand value for those events. Table 1 shows an example of a list of five highest demands.

TABLE 1

| Record | Date and Time | Demand |
|--------|---------------|--------|
| 1 | Day 23, 09:15 | 12.3 kilowatt-hours |
| 2 | Day 17, 09:45 | 11.9 kilowatt-hours |
| 3 | Day 03, 15:30 | 11.8 kilowatt-hours |
| 4 | Day 23, 14:15 | 11.0 kilowatt-hours |
| 5 | Day 11, 09:15 | 10.8 kilowatt-hours |

Figure 2:
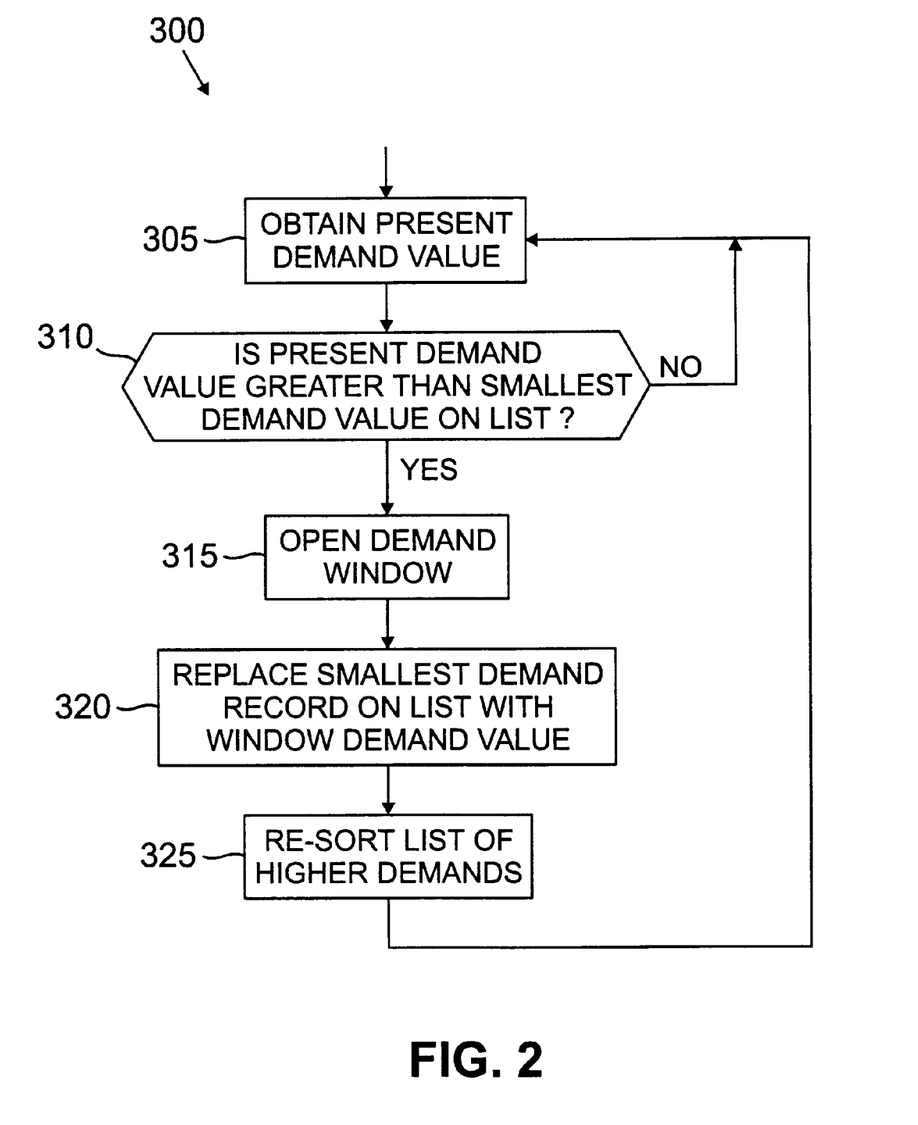
FIG. 2 shows a flow diagram of a five highest demands routine according to the present invention.

To generate the highest demand list, the controller 108 executes a highest demand routine. The controller 108 executes the highest demand routine in addition to controlling the metering functions as described above. FIG. 2 shows a flow diagram of an exemplary highest demand routine according to the present invention that may be executed by the controller 108. The flow diagram of FIG. 2 may be used to generate a five highest demand list such as that of Table 1.

Referring to FIG. 2 the highest demand routine 300 when executed by a controller in a metering device, generates a highest demand list using an event triggered demand window. As will be discussed further below, the event-triggered demand window reduces the likelihood that a single highest demand event will be represented by more than one record on the highest demand list. The highest demand routine 300 may suitably be executed by the controller of any meter that obtains energy consumption data and tracks time and date information, such as the controller 108 of FIG. 1.

The controller first, in step 305, generates a present demand value corresponding to the quantity of energy consumed within the most recent demand interval. A demand interval is a predetermined amount of time over which meaningful energy demand information may be obtained. Demand intervals are typically between 5 and 60 minutes. The demand interval may suitably describe contiguous blocks of time or overlapping blocks of time. The use of overlapping blocks of time, or rolling demand intervals, provides for better averaging of demand.

In the exemplary embodiment described herein, the demand interval is a rolling demand interval of 15 minutes. Each demand interval consists of five sub-intervals of three minutes each. A new demand interval is defined for every new sub-interval, and includes the newest sub-interval plus the previous four sub-intervals. For example, a demand interval at 12:00 may include sub-intervals at 11:48, 11:51, 11:54, 11:57 and 12:00. Meanwhile, the next interval, at 12:03, would include subintervals at 11:51, 11:54, 11:57 12:00 and 12:03. The use of a rolling demand interval is well known in the art.

The quantity of energy consumed over the demand interval is determined using the energy consumption data generated by the meter. In the exemplary meter 10 of FIG. 1, the controller 108 determines the quantity of energy consumed by accumulating the energy consumption pulses over each demand interval. While a demand value representative of the energy consumed during a demand interval may be calculated in many ways, the method of the present invention determines an average power consumption by calculating the energy consumed over the demand interval and dividing by the duration. Energy divided by time yields a result in units of power or watts.

Referring again to FIG. 2, after step 305, the controller executes step 310. In step 310, the controller determines whether the present demand value for the most recent demand interval is greater than a smallest demand value on the highest demand list. To this end, the controller stores in an associated memory, such as the nonvolatile memory 110 of the meter 10 in FIG. 1, the list of the highest demands, which may be similar to the one illustrated in Table 1, discussed above. As shown in Table 1, the highest demands list preferably orders the records from the one with the largest demand value to the record with the smallest demand value in descending order. If the present demand value exceeds the smallest demand value on the list, then the controller determines that a highest demand event has occurred and proceeds to step 315. Thus, for an example involving the list in Table 1, if the present demand value is 11.4 kilowatt-hours, then the controller determines that a highest demand event has occurred. If not, however, then the controller returns to step 305 and awaits the completion of another demand interval.

In step 315, the controller opens a demand window in response to the occurrence of a highest demand event. The demand window has a duration exceeding the demand interval, and may either be a fixed duration or a variable duration. An illustration of a variable duration demand window is described in detail below in connection with FIG. 3. After opening a demand window, the controller thereafter, in step 320 stores a select demand value falling within the demand window or simply window demand value, on the list of highest demands. Typically, the window demand value is the highest demand value within the demand window. In addition to storing the window demand value, the controller also preferably removes the smallest demand from the list of highest demands, assuming the list of highest demands is fully populated.

For example, if the list of highest demands contains the five highest demands, and a demand window is opened in step 315, then in step 320, the controller would replace the lowest of the five highest demand values with the highest window demand. Thus, in the example involving Table 1, the controller replaces entry 5 on the highest demand list with the record associated with the present demand value. A detailed discussion of the operations associated with step 320 in an exemplary embodiment of the present invention is discussed below in connection with FIG. 3.

After completion of step 320, the controller executes step 325. In step 325, the controller re-sorts the list of highest demands. To this end, the controller orders the list of highest demands from the record associated with largest demand value to the record associated with the smallest demand value. Those of ordinary skill in the art may readily implement an elementary sorting routine to sort a list of relatively few, for example, five, highest demand values.

Figure 3:
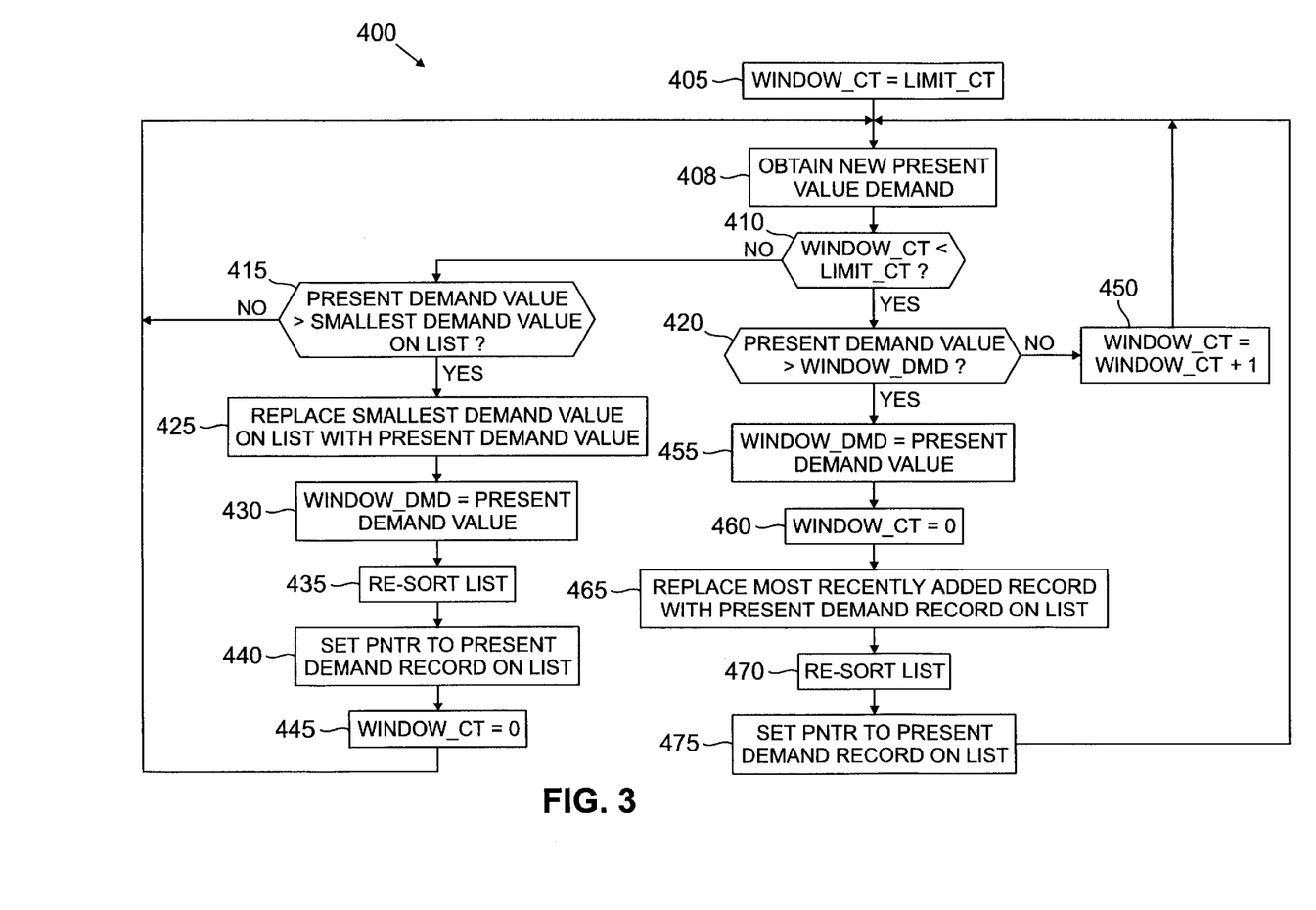
FIG. 3 shows a more detailed set of operations performed by the processor according to the present invention.

FIG. 3 shows a more detailed flow diagram 400 of the operations executed by a controller in a utility meter in an exemplary embodiment of the invention. In particular, the flow diagram of FIG. 3 shows in further detail the flow diagram of FIG. 2 for a specific embodiment of the present invention. In this embodiment, the demand window is of variable length.

Step 405 essentially consists of an initialization step. In step 405, the controller sets a variable WINDOW_CT equal to a value LIMIT_CT, wherein LIMIT_CT is the minimum demand window size measured in demand intervals. LIMIT_CT is a predetermined limit which may suitably be set equal to 20 demand intervals. Thus, if a demand interval has a fifteen minute duration, and a new rolling demand interval begins every three minutes, the minimum demand window size is sixty minutes.

After completion of step 405, the controller begins the normal operating loop of the flow diagram 400. Specifically, in step 408, the controller obtains a demand value associated with the most recent demand interval, or simply a present demand value. The controller then proceeds to step 410. In step 410, the controller determines whether WINDOW_CT is less than CT_LIMIT. In other words, the controller determines whether a demand window is currently open. If not, then the controller proceeds to step 415. If, however, the controller determines that the a demand window is currently open, i.e., that WINDOW_CT<CT_LIMIT, then the controller proceeds to execute step 420, discussed further below.

Referring to step 415, the controller determines whether the present demand value is greater than the smallest demand value on the list of highest demands. If not, then the controller returns to execute step 408 and awaits completion of the next demand interval. If, however, the present demand value exceeds the smallest demand value on the highest demand list, then the controller proceeds to a sequence of steps commencing with step 425 in which a new demand window is opened.

In particular, in step 425, the controller updates the list by replacing the record associated with the smallest demand value, or simply smallest demand record, with a record corresponding to the present demand value, or simply present demand record. Similar to all the records on the highest demand list, the present demand record comprises the present demand value and a demand interval identifier. The demand interval identifier typically consists of the time and date on which the interval commenced.

Then, in step 430, the controller sets a variable WINDOW_DMD to the present demand value. Thereafter, in step 435, the controller re-sorts the list in order to insure that the present demand record is properly placed in appropriate order on the list. As discussed above, the records on the list are preferably ordered from the record with the highest demand value to the record with the lowest demand value. After completion of the re-sorting operation in step 435, the controller in step 440 defines a pointer PNTR which identifies the present demand record on the list. Finally, the controller in step 445 sets the variable WINDOW_CT equal to zero.

After the demand window is opened in steps 425 through 445, the controller returns to step 408. The controller then, upon receiving a new present demand value for the next demand interval, proceeds as described above in connection with step 410. However, because the controller has set WINDOW_CT equal to zero in step 445, the controller determines in step 410 that WINDOW_CT<LIMIT_CT, and therefore proceeds to step 420. The sequence of steps that begin with step 420 relate to the operations executed by the controller when a demand window is open.

In step 420, the controller determines whether the new present demand value is greater than WINDOW_DMD. If not, then the controller increments WINDOW_CT in step 450 and returns to step 408 to await the next present demand value. If, however, the present demand value is greater than WINDOW_DMD, then the controller proceeds to step 455.

In step 455, the controller replaces WINDOW_DMD with the present demand value. Thereafter, the controller sets the variable WINDOW_CT equal to zero in step 460. Accordingly, the controller effectively extends the duration of the window by changing WINDOW_CT to zero regardless of its previous value. Thus, the controller extends the duration of the demand window whenever the present demand value exceeds the previous window demand value.

After step 460, the controller executes step 465. In step 465, the controller replaces the record associated with the previous window demand value on the list of highest demand values with the present demand record. To this end, the controller replaces the record identified by the pointer PNTR with the present demand record. As a result, the controller will only add a single demand record to the list of highest demands for the duration of the demand window.

Thereafter, in step 470, the controller re-sorts the highest demand list to insure proper placement of the present demand record within the list. After completion of step 470, the controller in step 475 resets the pointer PNTR to identify the present demand record on the list. After completion of step 475, the controller returns to step 408 to await completion of the next demand interval.

The present invention thus provides an improved technique for identifying a finite number of highest demands within a time period, e.g., a monthly billing period. One advantage relates to the use of an event-triggered demand window definition. Specifically, steps 425 through 445, which effectively open a demand window, are only executed when the present demand value is large enough to qualify for inclusion on the list of highest demands. Then, only one demand record is added to the list for any one demand window, as illustrated by steps 455, 465, and 475.

The use of the event-triggered demand window reduces the likelihood that a single highest demand event will be represented as multiple records on the list. As a result, the highest demand list provides a better indication of the different peak usage times in a billing period. Specifically, multiple representation is more likely in prior systems that use prescheduled windows because a highest demand event could occur at the end of one demand window and continue into the beginning of another demand window. By contrast, the present invention does not preschedule windows, but rather triggers the beginning of a demand window on the occurrence of a highest demand event. That highest demand event would essentially have to last the duration of the entire demand window in order for a single demand event to be counted twice. If the demand window is selected for an appropriate duration, which may be one hour, two hours, eight hours or even twenty-four hours, the likelihood of multiple representation of a single highest demand event is substantially reduced.

Another feature of the embodiment of the present invention illustrated in FIG. 3 is the use of the variable length window, which further reduces the likelihood that a single demand event will be double counted on the highest demand list. As discussed in a connection with step 460, the controller extends the demand window any time the present demand value within a demand window exceeds the window demand value. The demand window extension provided in the embodiment of FIG. 3 reduces the possibility that a single demand event of long duration will be registered multiple times on the list of highest demands.

Figure 4:
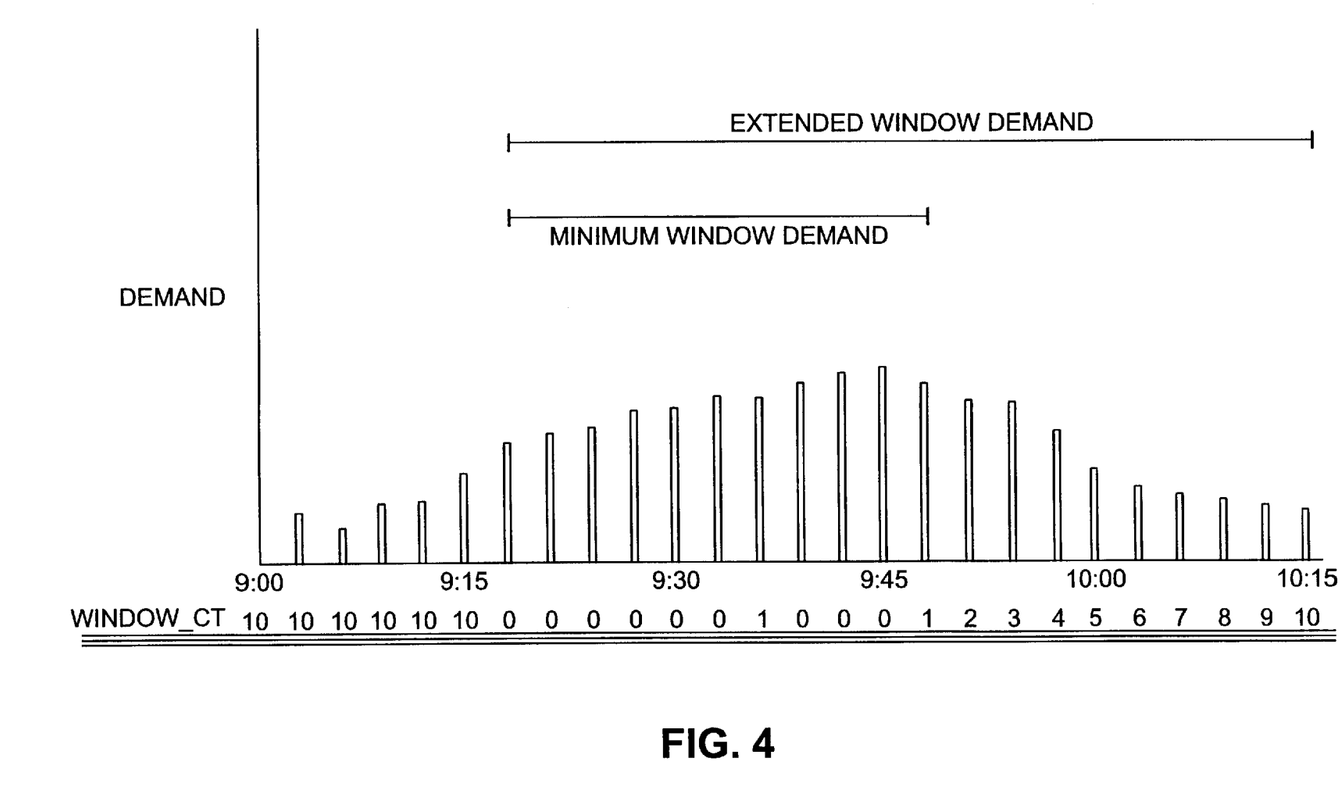
FIG. 4 shows a chart of sample demand values corresponding to a plurality of demand intervals.

For example, FIG. 4 shows chart of demand values for demand intervals on a sample day between 9:00 and 10:15. In the example of FIG. 4, the minimum demand window length is 30 minutes, or 10 demand intervals. To illustrate the benefits provided by the use of a window of variable duration, it is assumed that the demand value 9:18 qualifies as one of the five highest demands. If the window duration is strictly ten intervals, it can be seen that a highest demand record will be generated for windows at both 9:18 and 9:48. However, the above described embodiment extends the demand window each time the present demand exceeded the window demand value. As illustrated in the example of FIG. 4, the demand window is extended at each of the 9:21, 9:24, 9:27, 9:30, 9:33, 9:39 9:42 and 9:45 demand intervals. Because no demand values exceed the demand value at 9:45, the demand window is extended only to ten demand intervals past 9:45, or until 10:15. Accordingly, only one demand record is entered for the example illustrated in FIG. 4 using the variable window duration definition according to the present invention.

Referring again to FIG. 3, while the flow diagram 400 describes the exemplary flow diagram of the operations executed by the controller to generate and maintain a list of highest demand, the following pseudocode discloses software steps suitable for accomplishing the objectives of the that flow diagram:

if WINDOW_CT<LIMIT_CT
  then if present demand value>WINDOW_DMD
    then
      WINDOW_DMD=present demand value
      WINDOW_CT=0
      last updated value on list=present demand value
      re-sort list
      set PNTR to last updated value on list
    else increment WINDOW_CT
  else if present demand value>smallest demand value on list
    then
      smallest demand value=present demand value
      last updated value on list=present demand value
      WINDOW_DMD=present demand value
      re-sort list of high demands
      set PNTR to last updated value on list
      WINDOW_CT=0
repeat It will be appreciated that the above described embodiments of the present invention are merely illustrative, and that those of ordinary skill in the art may readily devise their own implementations that incorporate the principles of the present invention and fall within the spirit and scope thereof.

We claim:

1. An electric utility meter comprising at least one sensor circuit for measuring voltage and current and generating voltage and current measurement signals therefrom, a conversion circuit connected to the sensor circuit and operable to receive the voltage and current measurement signals and generate power consumption signals therefrom, a memory location containing a list of highest demands, and a controller operable to:

(a) generate a demand value corresponding to a quantity of energy consumed within a demand interval based on the power consumption signals;

(b) determine whether the demand value for the demand interval is greater than a smallest demand value on the list of highest demands in the memory location;

(c) open a demand window if the demand value is greater than the smallest demand value, the demand window having a duration exceeding the demand interval;

(d) obtain a plurality of additional demand values for the duration of the demand window, each of said additional demand values corresponding to one of a plurality of additional demand intervals within the demand window; and (e) record in the list of highest demands in the memory location a select demand value comprising one of the demand value and the plurality of additional demand values.

2. The electric utility meter of claim 1 wherein the controller is further operable to record in the list of highest demands data identifying the demand interval corresponding to the select demand value.

3. The electric utility meter of claim 1 wherein the controller is further operable to record in the list of highest demands in the memory location the select demand value, wherein said select demand value comprises a highest demand value of the demand value and the plurality of additional demand values.

4. The electric utility meter of claim 1 wherein the controller is further operable to open the demand window wherein the demand window has an increased duration if one of the plurality of additional demand values exceeds the demand value.

5. The electric utility meter of claim 3 wherein the controller is further operable to open the demand window wherein the demand window has an increased duration if one of the plurality of additional demand values exceeds the demand value.

6. The electric utility meter of claim 3 wherein the controller is further operable to open the demand window wherein the demand window has a minimum window duration and the duration extends from the demand interval in which the window was opened to the demand interval corresponding to the highest demand value plus the minimum window duration.

7. The electric utility meter of claim 1 wherein the controller is further operable to remove the smallest demand value from the list of highest demands.

8. The electric utility meter of claim 7 wherein the controller is further operable to sort the list of highest demands from a largest demand value to a new smallest demand value.

9. An electric utility meter comprising at least one sensor circuit for measuring voltage and current and generating voltage and current measurement signals therefrom, a processor connected to the sensor circuit and operable to receive the voltage and current measurement signals and generate power consumption signals therefrom, a memory location, and a controller operable to:

(a) generate a present demand value based on the power consumption signals received from the sensor circuit within a demand interval;

(b) determine whether the present demand value is greater than a smallest demand value on a highest demand list;

(c) open a demand window having a variable duration if the present demand value is greater than the smallest demand value, the variable duration exceeding a minimum duration;

(d) generate subsequent present demand values for subsequent demand intervals;

(e) determine a window demand value based on the present demand value and subsequent demand values; and (f) record in the memory location the window demand value.

10. In an electric utility meter comprising at least one sensor circuit for measuring voltage and current and generating voltage and current measurement signals therefrom, a conversion circuit connected to the sensor circuit and operable to receive the voltage and current measurement signals and generate power consumption signals therefrom, a memory location containing a list of highest demands, and a controller, a method of updating a list of highest demands, the method comprising:

(a) generating a demand value corresponding to a quantity of energy consumed within a demand interval based on the power consumption signals;

(b) determining whether the demand value for the demand interval is greater than a smallest demand value on the list of highest demands in the memory location;

(c) opening a demand window if the demand value is greater than the smallest demand value, the demand window having a duration exceeding the demand interval;

(d) obtaining a plurality of additional demand values for the duration of the demand window, each of said additional demand values corresponding to one of a plurality of additional demand intervals within the demand window; and (e) recording in the list of highest demands in the memory location a select demand value comprising one of the demand value and the plurality of additional demand values.

11. The method of claim 10 wherein step (e) further comprises recording in the list of highest demands data identifying the demand interval corresponding to the select demand value.

12. The method of claim 10 wherein step (e) further comprises recording in the list of highest demands in the memory location the select demand value wherein said select demand value comprises a highest demand value of the demand value and the plurality of additional demand values.

13. The method of claim 10 wherein the step (c) further comprises opening the demand window wherein the demand window has an increased duration if one of the plurality of additional demand values exceeds the demand value.

14. The method of claim 12 wherein step (c) further comprises opening the demand window wherein the demand window has an increased duration if one of the plurality of additional demand values exceeds the demand value.

15. The method of claim 12 wherein step (c) further comprises opening the demand window wherein the demand window has a minimum window duration and the duration extends from the demand interval in which the window was opened to the demand interval corresponding to the highest demand value plus the minimum window duration.

16. The method of claim 10 wherein step (e) further comprises removing the smallest demand value from the list of highest demands.

17. The method of claim 10 further comprises step (f) of sorting the list of highest demands from a largest demand value to a new smallest demand value.

* * * * *